United States Patent [19]

Faes et al.

[11] Patent Number: 5,035,322
[45] Date of Patent: Jul. 30, 1991

[54] ROD MAGAZINE FOR ELECTRICAL OR ELECTRONIC COMPONENTS

[75] Inventors: Franciscus C. M. Faes; Josephus M. M. Van Gastel; Johannes T. A. Van De Ven; Petrus A. C. Verberne, all of Eindhoven, Netherlands

[73] Assignee: U.S. Philips Corporation, New York, N.Y.

[21] Appl. No.: 517,267

[22] Filed: May 1, 1990

[30] Foreign Application Priority Data

Nov. 3, 1989 [NL] Netherlands ............... 8902715

[51] Int. Cl.⁵ ............................................. B65D 73/02
[52] U.S. Cl. ..................................... 206/328; 206/334; 221/312 A
[58] Field of Search ............... 206/328, 330, 331, 332, 206/334, 1.5, 493, 499, 583, 526; 221/312 A, 312 R

[56] References Cited

U.S. PATENT DOCUMENTS

| | | | |
|---|---|---|---|
| 2,939,619 | 6/1960 | Levesque | 221/312 A |
| 2,949,182 | 8/1960 | Williams | 206/331 |
| 3,545,154 | 7/1964 | Peters et al. | 206/330 X |
| 4,353,481 | 10/1982 | Tando | 206/499 X |
| 4,415,083 | 11/1983 | Kemkers | 206/334 |
| 4,752,005 | 6/1988 | Hofmann et al. | 206/334 |
| 4,836,371 | 6/1989 | Long et al. | 206/334 |
| 4,899,876 | 2/1990 | Murphy et al. | 206/334 |

FOREIGN PATENT DOCUMENTS

| | | | |
|---|---|---|---|
| 3333374 | 2/1985 | Fed. Rep. of Germany | |
| 246388 | 1/1948 | Switzerland | 221/312 A |

*Primary Examiner*—Bryon P. Gehman
*Attorney, Agent, or Firm*—William Squire

[57] ABSTRACT

A rod magazine for electrical and/or electronic components, more particularly for air coils, comprising a rod-shaped holder comprising a magazine chamber of U-shaped cross-section and a component support needle cantilevered from the holder at one needle end and extending freely through the magazine chamber throughout its length.

25 Claims, 2 Drawing Sheets

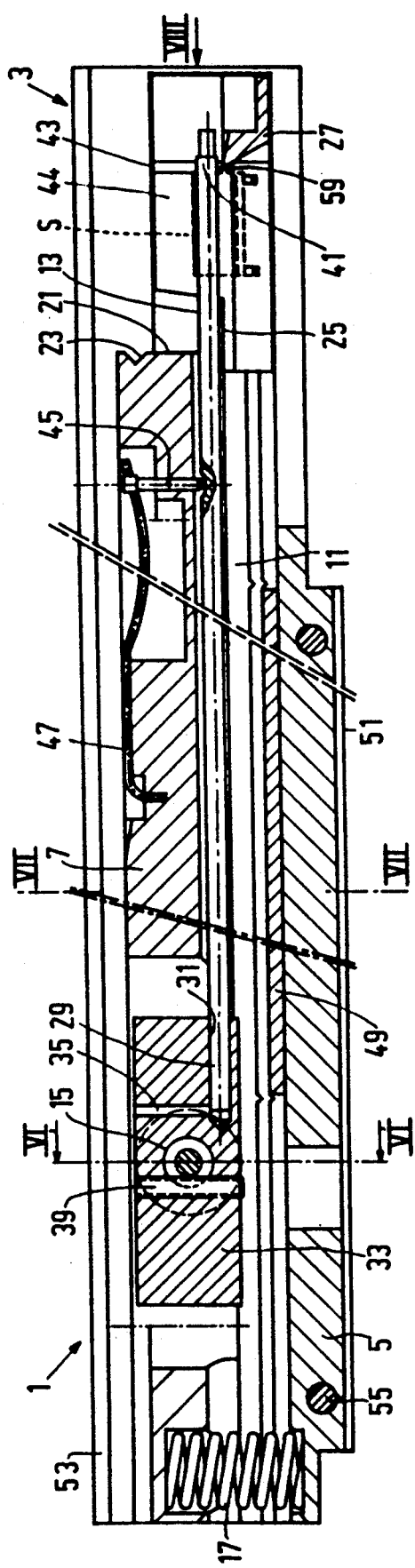
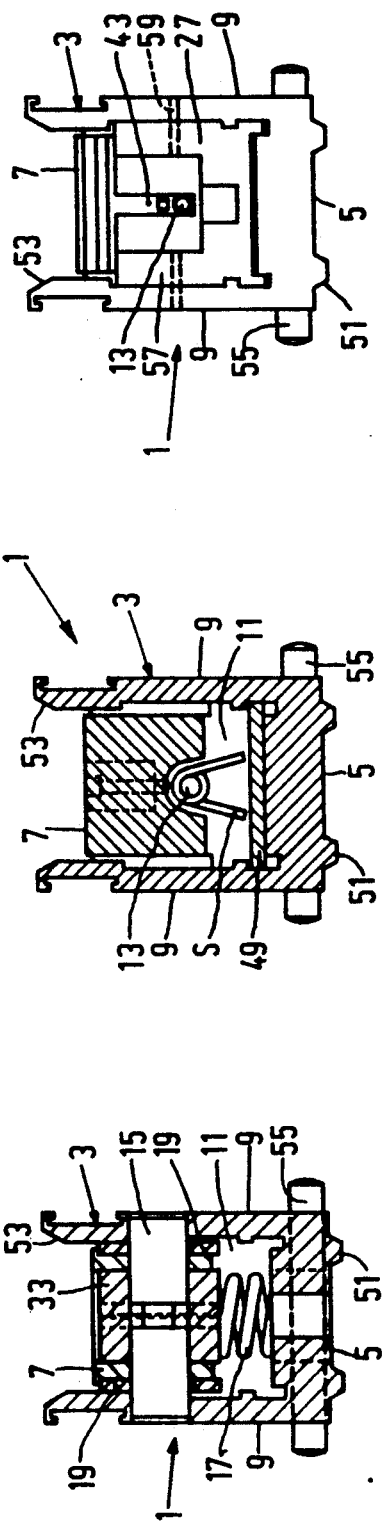
FIG.5
FIG.8
FIG.7
FIG.6

ROD MAGAZINE FOR ELECTRICAL OR ELECTRONIC COMPONENTS

The invention relates to a rod magazine for electrical and/or electronic components comprising a rod-shaped holder having a bottom portion, a roof portion and two sidewall portions, which portions enclose a magazine chamber, which has a substantially U-shaped cross-section, which rod magazine further comprises a guide for the components to be accommodated, which extends parallel to the longitudinal direction of the holder. Of interest is commonly owned copending application entitled "Method and Device for Placing Air Coils on a Printed Circuit Board" Ser. No. 527,996 filed May 22, 1990 in the name of A. Heynen.

In such a rod magazine known from DE-A 33 33 374, the guide is constituted by an indentation in the bottom portion, on which the components will bear with their component bodies. This known construction is especially intended for receiving IC components, DIL components and the like. This known rod magazine is not suitable for air coils.

Air coils, which are mainly used frequently in T.V. tuners, have a light weight, are slightly resilient and are readily deformable and hence vulnerable; for all these reasons, air coils can be processed only with difficulty. Apparatuses for mechanically mounting air coils on printed circuit boards are substantially not commercially available. Hitherto, air coils are therefore mostly mounted manually on printed circuits boards.

The invention has for its object to provide a rod magazine, which is particularly suitable to receive air coils without deformation and without damage and to deliver them again in orderly fashion and without disturbances, which rod magazine thus facilitates the mechanical processing of air coils.

According to the invention, this object is mainly achieved in that the guide is constituted by a needle, which extends freely through the magazine chamber throughout its length.

The air coils are consecutively threaded onto the needle without hooking to each other. This threading operation can be effected by hand or mechanically, for example directly from the winding mandrel, onto which the air coils are wound. The threaded air coils hang freely on the needle and normally their connection legs are directed downwards due to the force of gravity. The diameter of the needle is smaller than the inner diameter of the air coils to be accommodated and is chosen so that the air coils on the needle can be displaced with a minimum amount of friction.

A positioning of the air coils independent of the force of gravity is obtained in a preferred embodiment of the rod magazine according to the invention in that the roof portion is in the form of a gutter and in cross-section has a U-shaped profile. The gutter-shaped roof portion, whose U-shaped profile is slightly adapted to the outer circumference of the air coils to be accommodated, surrounds at a certain distance the threaded air coils in such a manner that the air coils on the needle can be freely displaced and can slightly swing, but are locked against undesired rotation. Also during the transport and during the manipulation of the rod magazines filled with air coils, the air coils remain positioned.

In another preferred embodiment of the rod magazine according to the invention, the roof portion is rotatably secured in the holder and is pressed by a spring towards the bottom portion. By rotating the roof portion away from the bottom portion against the action of the spring, the magazine chamber is released and the needle is freely accessible, as a result of which the threading of the air coils is facilitated.

In a further preferred embodiment of the rod magazine according to the invention, the needle is secured with one hindmost end in a pivot block, which is rotatably journalled in the holder, and it bears with the other foremost end on a supporting block. Due to the fact that the needle is rotatably journalled in the holder, the accessibility of the needle is further improved both with regard to threading of the air coils by hand or mechanically and with regard to the orderly delivery of the air coils, preferably mechanically. The needle and the roof portion are rotatable independently of each other.

A further improvement of the positioning of the threaded air coils is obtained in still another preferred embodiment of the rod magazine according to the invention in that a floor portion is provided on the bottom portion and extends substantially throughout the length of the magazine chamber. Normally, the ends of the connection legs of the air coils are located at a certain distance from the bottom portion so that a limited swinging movement is possible. In order to slightly limit such a swinging movement with air coils having comparatively short connection legs, the distance between the ends of the connection legs and the bottom portion is reduced in that the floor portion is provided. Also in this case, the ends of the connection legs do not touch the floor portion.

In a further preferred embodiment of the rod magazine according to the invention, a braking pin is provided in the roof portion near the foremost end of the needle and this pin is pressed against the needle by a braking spring. The free end of the needle is pressed against the supporting block by the braking spring and the braking pin. The braking pin and the braking spring serve for the separation of the air coils described more fully in a copending Application of the Applicant.

In a still further preferred embodiment of the rod magazine according to the invention, the bottom portion is provided with two longitudinal ribs and the two sidewall portions have correspondingly formed supporting surfaces. Due to this measure, it is possible to position and stack a number of rod magazines, which is of importance for the mechanical processing of the air coils.

The invention will be described more fully with reference to the drawing. In the drawing:

FIG. 5 shows on an enlarged scale a longitudinal sectional view of the rod magazine taken on the line V—V in FIG. 4;

FIG. 6 shows a cross-section of the rod magazine taken on the line VI—VI in FIG. 5;

FIG. 7 shows a cross-section of the rod magazine taken on the line VII—VII in FIG. 5; and FIG. 8 is a front elevation taken on the arrow VIII in FIG. 5.

FIGS. 1 and 2 show an embodiment of an air coil S having a length L, a coil diameter D corresponding to the inner diameter of the air coil, a wire diameter d and a pitch distance P between the turns; the two connection legs C of the air coil enclose an angle 2a. The connection legs C have a length l.

Such air coils are used in different embodiments, especially in T.V. tuners. The most frequently used air coils having a winding or coil diameter which may vary from 1.7 to 3.7 mm, a length between 1.5 and 11.5 mm and a wire diameter of 0.4 to 0.5 mm; the number of turns may vary between 1.5 and 20.5. The air coils are generally made of copper wire. Such air coils are readily deformable, have resilient properties and are very vulnerable. It must be ensured that such air coils are not deformed by placement operations, i.e. by operations carried out after the air coils have been wound. A damage and an undesired deformation of the air coils can be prevented by the use of the rod magazine according to the invention, which also facilitates mounting of such air coils on printed circuit boards and permits mechanical mounting.

Figure 2:
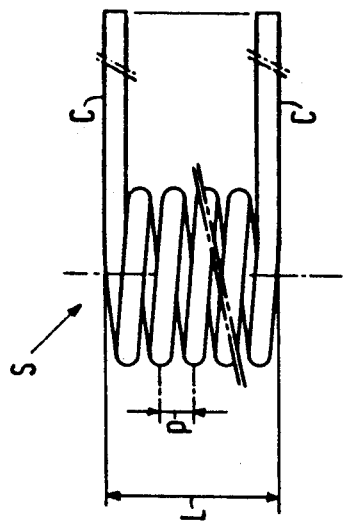
FIG. 2 is a side elevation of the air coil shown in FIG. 1.
Figure 1:
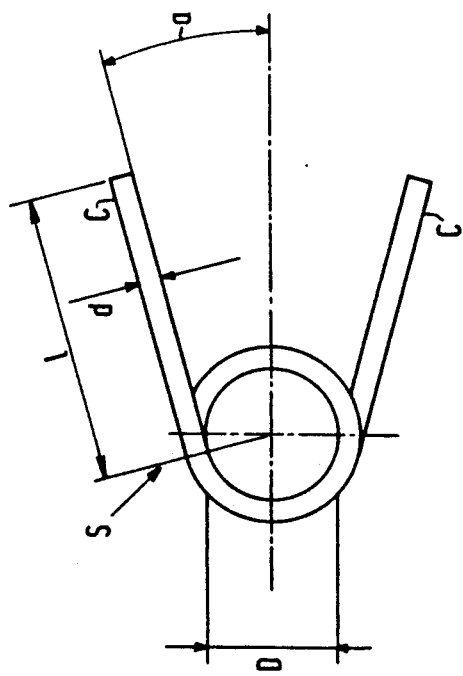
FIG. 1 is a front elevation of an air coil.
Figure 3:
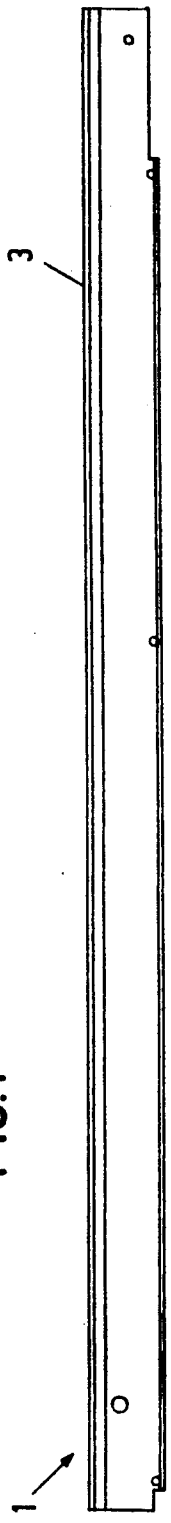
FIG. 3 is a side elevation of an embodiment of a rod magazine according to the invention.
Figure 4:
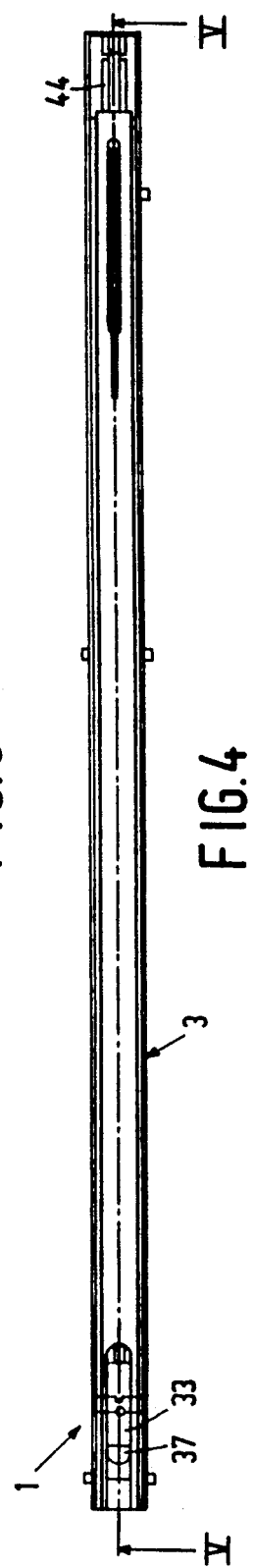
FIG. 4 is a plan view of the rod magazine shown in FIG. 3.

The rod magazine 1 shown in FIGS. 3 to 8 comprises a rod-shaped holder 3 having a bottom portion 5, a roof portion 7 and two sidewall portions 9, which portions enclose a magazine chamber 11, which has a substantially U-shaped cross-section. The rod magazine 1 further comprises a needle 13, which extends freely through the magazine chamber throughout the length thereof. The roof portion 7 is in the form of a gutter and has in cross-section a U-shaped profile, which, as can be seen in FIG. 7, extends substantially parallel to and at a certain distance from the air coils S to be accommodated. The roof portion 7 is pivotably journalled on a shaft 15 and can be rotated against the action of a spring 17 in a direction away from the bottom portion 5. The shaft 15 is secured in the two sidewall portions 9. Spacer rings 19 are arranged between the roof portion 7 and the sidewall portions 9. The foremost free end 21 of the roof portion 7 is provided with a notch 23 in order to facilitate lifting of the roof portion, manually or mechanically. In the rest position shown, the roof portion 7 bears with its free end 21 on two supporting ribs 25 of a supporting block 27 and is pressed by the spring 17 in the direction of the bottom portion 5 against the supporting block 27. The needle 13 is secured with one hindmost end 29 in a bore 31 of a pivot block 33 and is locked in this bore by means of a locking pin 35. The pivot block 33 is arranged in a recess 37 of the roof portion 7 and is also pivotably journalled on the shaft 15 and is locked on this shaft by means of a locking screw 39. The pivot block 33 with the needle 13 and the roof portion 7 can be pivoted about the shaft 15 with respect to each other. In the embodiment shown in the drawing, the needle 13 bears with the foremost free end 41 on the supporting block 27 in a recess 43 thereof. The needle 13 is pressed against the supporting block 27 by a braking pin 45 and a braking spring 47 cooperating with this pin. The braking pin 45 and the braking spring 47 are secured on the roof portion 7. In the embodiment shown, a floor portion 49 is secured on the bottom portion 5, especially intended for receiving air coils having comparatively short connection legs. The floor portion 49 extends substantially throughout the length of the magazine chamber 11. The bottom portion 5 is provided on the lower side with two longitudinal ribs 51, while the two sidewall portions 9 have correspondingly formed supporting surfaces 53. The longitudinal ribs and the supporting surfaces 53 serve for the relative positioning of a number of stacked rod magazines. Pins 55 provided in the bottom portion 5 serve for positioning the rod magazine in a device for mechanically mounting the air coils on a printed circuit board.

The bottom portion 5 with the two sidewall portions 9 and the roof portion 7 are formed by extrusion profiles, which can be manufactured at low cost and in an efficient manner. These extrusion profiles can be made of synthetic material, but are preferably made of light metal, which is most suitable in view of the professional application. The two extrusion profiles can be used for most of the conventional air coils. Any variations in the length l of the connection legs of the air coils can be compensated for by providing the floor portion 49 and-/or by causing the thickness of the floor portion to vary. The needle 13 is designed for a specific product, however, because the diameter of the needle must be adapted to the diameter of the air coils to be accommodated. The pivot block 33 also constitutes indirectly a part dependent upon the product because the bore 31 in the pivot block 33 must be adapted to the diameter of the needle 13.

In FIG. 5, a coil S is indicated by broken lines in the delivery position in a shaft 44 of the holder 3. After the roof portion 7 has been lifted, the needle 13 can be raised so that the coil S is released and can be removed from the needle by hand or mechanically and can be mounted on a printed circuit board. In order to ascertain whether an air coil S is or is not in the delivery position in the shaft 44 at the end of the needle 13, the two sidewall portions 9 and side walls 57 of the supporting block 37 can be provided with bores 59 so that an optical transmitter and an optical receiver can be arranged on either side of the sidewall portions 9 with a view to the detection of the presence of an air coil in the delivery position.

What is claimed is:

1. A rod magazine extending in a given direction for holding components comprising a rod-shaped holder having a bottom portion, a roof portion and two sidewall portions extending in said given direction, which portions enclose a magazine chamber extending in said direction, which chamber has a substantially U-shaped cross-section, which rod magazine further comprises a component support needle guide for receiving and supporting components to be secured to the holder, said guide extending in said given direction suspended freely through the magazine chamber throughout the guide length, said magazine including a pivot block and a supporting block, the needle guide being secured with one end in said pivot block, said pivot block being rotatably journalled in the holder, said needle guide bearing with the other end on said supporting block.

2. A rod magazine as claimed in claim 1, wherein the roof portion has U-shaped cross-section profile.

3. A rod magazine as claimed in claim 2 including a spring and wherein the roof portion is rotatably secured in the holder and is pushed by said spring towards the bottom portion.

4. A rod magazine as claimed in claim 2 wherein said holder includes a floor member secured to the bottom portion and which member extends substantially throughout the length of the magazine chamber.

5. A rod magazine as claimed in claim 2 further including a braking pin in the roof portion near the one end of the needle guide, and a braking spring for pressing the pin against the needle guide.

6. A rod magazine as claimed in claim 2 wherein the bottom portion includes two longitudinal ribs and the two sidewall portions have supporting surfaces shaped to mate with and receive the roof portion therebetween.

7. A rod magazine as claimed in claim 1 including a spring and wherein the roof portion is rotatably secured in the holder and is pushed by said spring towards the bottom portion.

8. A rod magazine as claimed in claim 7 wherein said holder includes a floor member secured to the bottom portion and which member extends substantially throughout the length of the magazine chamber.

9. A rod magazine as claimed in claim 7 further including a braking pin in the roof portion near one end of the needle guide, and a braking spring for pressing the pin against the needle guide.

10. A rod magazine as claimed in claim 7 wherein the bottom portion includes two longitudinal ribs and the two sidewall portions have supporting surfaces shaped to mate with and receive the roof portion therebetween.

11. A rod magazine as claimed in claim 1 wherein said holder includes a floor portion secured to the bottom portion and extends substantially throughout the length of the magazine chamber.

12. A rod magazine as claimed in claim 11 further including a braking pin in the roof portion near one end of the needle guide, and a braking spring for pressing the pin against the needle guide.

13. A rod magazine as claimed in claim 11 wherein the bottom portion includes two longitudinal ribs and the two sidewall portions have supporting surfaces shaped to mate with and receive the roof portion therebetween.

14. A rod magazine as claimed in claim 1 wherein the bottom portion includes two longitudinal ribs and the two sidewall portions have supporting surfaces shaped to mate with and receive the roof portion therebetween.

15. The magazine of claim 1 wherein the needle guide is cantilevered from and pivotally secured to the holder at one end of the needle guide.

16. The magazine of claim 1 wherein the roof portion has a sectional profile adapted to mate with received components.

17. A rod magazine extending in a given direction for holding components comprising a rod-shaped holder having a bottom portion, a roof portion and two sidewall portions extending in said given direction, which portions enclose a magazine chamber extending in said direction, which chamber has a substantially U-shaped cross-section, which rod magazine further comprises a needle component support guide for receiving and supporting components to be secured to the holder, said guide extending in said direction freely through the magazine chamber throughout the guide length, said magazine including a braking pin the roof portion near one end of the guide, and a braking spring for pressing the pin against the needle guide.

18. A rod magazine as claimed in claim 17 including a pivot block and a supporting block, the needle guide being secured with one end in said pivot block, said pivot block being rotatably journalled in the holder, said needle guide bearing with the other end on said supporting block.

19. A rod magazine as claimed in claim 17 wherein said holder includes a floor member secured to the bottom portion and which member extends substantially throughout the length of the magazine chamber.

20. A rod magazine extending in a given direction for holding components comprising a rod-shaped holder having a bottom portion, a roof portion and two sidewall portions extending in said given direction, which portions enclose a magazine chamber extending in said direction, which chamber has a substantially U-shaped cross-section, which rod magazine further comprises a needle component support guide for receiving and supporting components to be secured to the holder, said guide extending in said direction freely through the magazine chamber throughout the guide length, the roof portion having a U-shaped cross-section profile, said magazine including a pivot block and a supporting block, the needle guide being secured with one end in said pivot block, said pivot block being rotatably journalled in the holder, said needle guide bearing with its other end on said supporting block.

21. A rod magazine as claimed in claim 20 further including a braking pin in the roof portion near one end of the needle guide, and a braking spring for pressing the pin against the needle guide.

22. A rod magazine as claimed in claim 20 wherein the bottom portion includes two longitudinal ribs and the two sidewall portions have supporting surfaces shaped to mate with and receive the roof portion therebetween.

23. A rod magazine extending in a given direction holding components comprising a rod-shaped holder having a bottom portion, a roof portion and two sidewall portions extending in said given direction, which portions enclose a magazine chamber, extending in said direction, which chamber has a substantially U-shaped cross-section, which rod magazine further comprises a needle component support guide for receiving and supporting components to be secured to the holder, said guide extending in said direction freely through the magazine chamber throughout the guide length, said magazine including a spring and wherein the roof portion is rotatably secured in the holder and is pushed by said spring toward the bottom portion, and further including a pivot block and a supporting block, the needle guide being secured with one end in said pivot block, said pivot block being rotatably journalled in the holder, said needle guide bearing with its other end on said supporting block.

24. A rod magazine as claimed in claim 23 further including a braking pin in the roof portion near the one end of the needle guide, and a braking spring for pressing the pin against the needle guide.

25. A rod magazine as claimed in claim 23 wherein the bottom portion includes two longitudinal ribs and the two sidewall portions have supporting surfaces shaped to mate with and receive the roof portion therebetween.

* * * * *